(12) United States Patent
Park et al.

(10) Patent No.: US 10,982,108 B2
(45) Date of Patent: Apr. 20, 2021

(54) PHOTOPOLYMERIZABLE COMPOSITION FOR FORMING BEZEL PATTERN, METHOD FOR FORMING BEZEL PATTERN USING SAME, AND BEZEL PATTERN MANUFACTURED THEREBY

(71) Applicant: LG Chem, Ltd., Seoul (KR)

(72) Inventors: Sungeun Park, Daejeon (KR); Jaehyun Yoo, Daejeon (KR); Areum Kim, Daejeon (KR); Joonhyung Kim, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/604,044

(22) PCT Filed: Dec. 26, 2018

(86) PCT No.: PCT/KR2018/016610
§ 371 (c)(1),
(2) Date: Oct. 9, 2019

(87) PCT Pub. No.: WO2019/132486
PCT Pub. Date: Jul. 4, 2019

(65) Prior Publication Data
US 2020/0157368 A1    May 21, 2020

(30) Foreign Application Priority Data
Dec. 27, 2017  (KR) ........................ 10-2017-0180727

(51) Int. Cl.
| | | |
|---|---|---|
| *C08F 2/46* | (2006.01) |
| *C08F 2/50* | (2006.01) |
| *C08G 61/04* | (2006.01) |
| *C09D 11/38* | (2014.01) |
| *B41M 7/00* | (2006.01) |
| *C08G 59/24* | (2006.01) |
| *C08G 65/18* | (2006.01) |
| *C09D 10/00* | (2006.01) |
| *C09D 11/36* | (2014.01) |

(52) U.S. Cl.
CPC ............ *C09D 11/38* (2013.01); *B41M 7/009* (2013.01); *C08G 59/24* (2013.01); *C08G 65/18* (2013.01); *C09D 10/00* (2013.01); *C09D 11/36* (2013.01)

(58) Field of Classification Search
CPC ... C09D 11/033; C09D 11/324; C09D 11/101; C09D 11/36; C09D 11/38; C09D 11/37; C09D 171/00; C09D 9/00; C09D 10/00; B41M 7/09; Y02P 20/582; C08G 65/18; C08G 59/24; G03F 7/20
USPC ......................................... 522/168, 1; 520/1
See application file for complete search history.

(56) References Cited

U.S. PATENT DOCUMENTS

| | | | |
|---|---|---|---|
| 9,016,846 | B2 | 4/2015 | Ikeda et al. |
| 2014/0248811 | A1 | 9/2014 | Degroot et al. |
| 2015/0343767 | A1 | 12/2015 | Kuroda et al. |
| 2017/0130079 | A1 | 5/2017 | Mizuta et al. |
| 2017/0158812 | A1 | 6/2017 | Mizuta et al. |
| 2017/0198157 | A1 | 7/2017 | Park et al. |
| 2017/0218212 | A1 | 8/2017 | Park et al. |
| 2017/0227844 | A1 | 8/2017 | Park et al. |
| 2017/0298241 | A1 | 10/2017 | Park et al. |
| 2019/0106540 | A1 | 4/2019 | Mizuta et al. |
| 2019/0119443 | A1 | 4/2019 | Mizuta et al. |

FOREIGN PATENT DOCUMENTS

| | | | |
|---|---|---|---|
| EP | 2607433 A1 | 6/2013 |
| EP | 3162822 A1 | 5/2017 |
| EP | 3162830 A1 | 5/2017 |
| JP | 2006-299148 | * 11/2006 |
| JP | 2006299148 A | 11/2006 |
| JP | 2009021595 A | 1/2009 |
| JP | 2012256726 A | 12/2012 |
| JP | 5573485 B2 | 8/2014 |
| JP | 2015189947 A | 11/2015 |
| JP | 201627120 A | 2/2016 |
| JP | 201627127 A | 2/2016 |
| JP | 201627384 A | 2/2016 |
| KR | 20070012386 A | 1/2007 |
| KR | 20140072070 A | 6/2014 |
| KR | 20150138094 A | 12/2015 |
| KR | 20160030068 A | 3/2016 |
| KR | 20160037122 A | 4/2016 |

(Continued)

OTHER PUBLICATIONS

Yokota et al, JP 2006/299148 Machine Translation, Nov. 2, 2006 (Year: 2006).*
Yoo et al, WO 2018070654 Machine Translation, Apr. 19, 2018 (Year: 2018).*
International Search Report from Application No. PCT/KR2018/016610 dated Apr. 29, 2019, pp. 1-2.

*Primary Examiner* — Jessica Whiteley
(74) *Attorney, Agent, or Firm* — Lerner, David, Littenberg, Krumholz & Mentlik, LLP

(57) ABSTRACT

A photopolymerizable composition for forming a bezel pattern developed to be applied on a display substrate, a method for forming a bezel pattern using the same, a bezel pattern manufactured thereby, a display substrate comprising a bezel pattern manufactured thereby, and a rework method for removing a bezel pattern having a defective printed pattern are disclosed herein. In some embodiments, the composition includes a colorant, an epoxy monomer, an oxetane monomer, a vinyl monomer, a cationic photopolymerization initiator, an adhesion promoter and a diluting solvent, the oxetane monomer comprises a monofunctional oxetane monomer and a difunctional oxetane monomer. The composition is suitable for manufacturing a bezel pattern that is easily removed, has sufficient adhesion to a display substrate, and good curing sensitivity and pencil hardness, without requiring a high-temperature heating process.

20 Claims, 2 Drawing Sheets

(56) References Cited

FOREIGN PATENT DOCUMENTS

| KR | 20160071336 A | 6/2016 | | |
|----|---|---|---|---|
| KR | 101782216 B1 | 9/2017 | | |
| KR | 101782217 B1 | 9/2017 | | |
| WO | 2016093672 A1 | 6/2016 | | |
| WO | WO-2018070654 A1 * | 4/2018 | ............. | C08G 59/18 |

* cited by examiner

[Fig. 1]
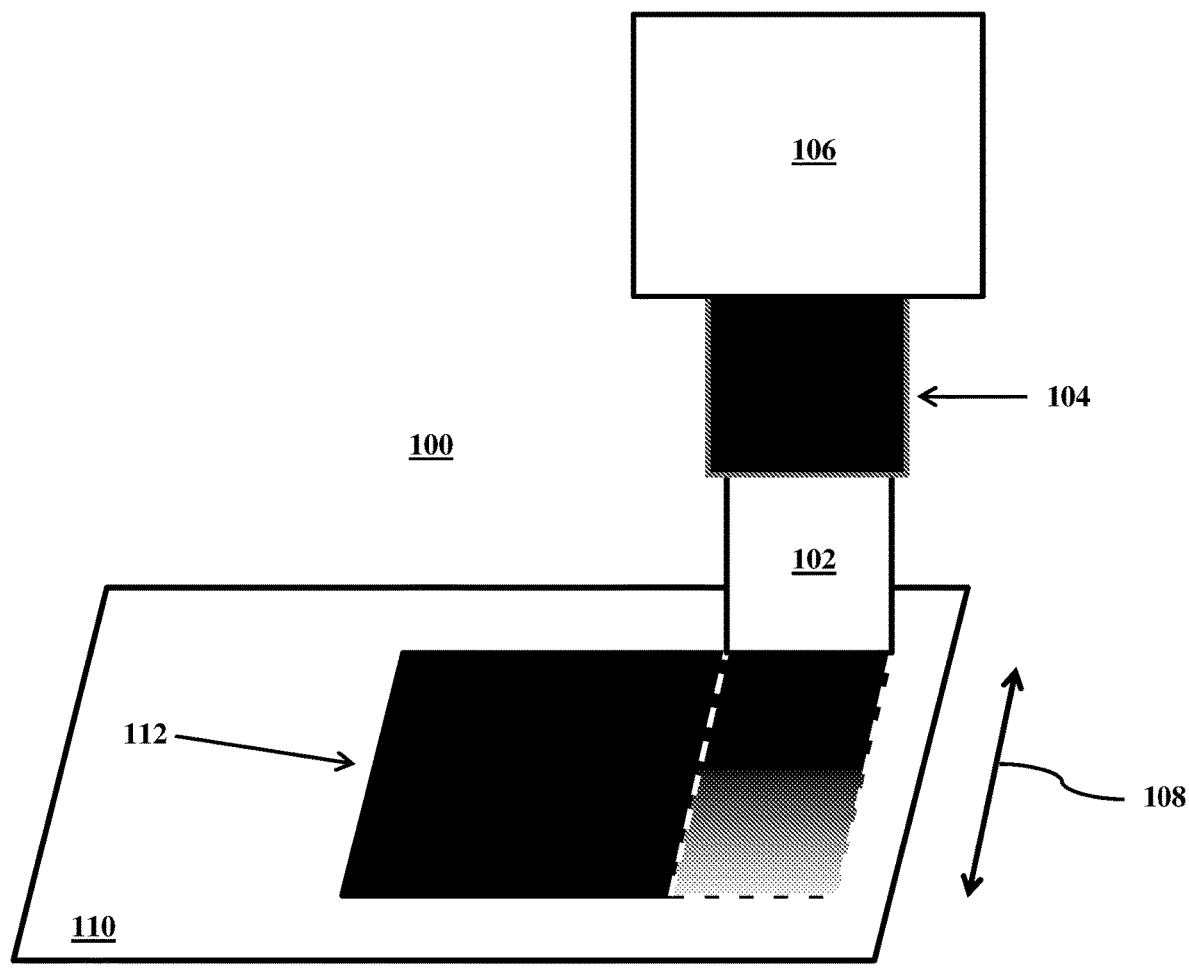

[Fig. 2A]
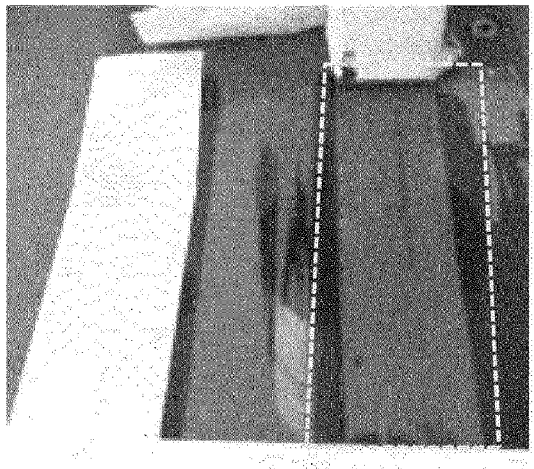
Completely peeled off within 50 times
[Fig. 2B]
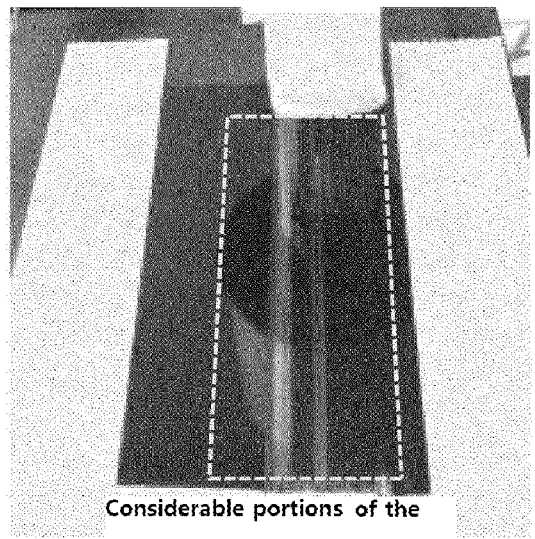
Considerable portions of the coating remain, after 50 times.

PHOTOPOLYMERIZABLE COMPOSITION FOR FORMING BEZEL PATTERN, METHOD FOR FORMING BEZEL PATTERN USING SAME, AND BEZEL PATTERN MANUFACTURED THEREBY

CROSS-REFERENCE TO RELATED APPLICATION(S)

The present application is a national phase entry under 35 U.S.C. § 371 of International Application No. PCT/KR2018/016610, filed on Dec. 26, 2018, which claims the benefit of priority from Korean Patent Application No. 10-2017-0180727, filed on Dec. 27, 2017, the disclosures of which are incorporated herein by reference.

FIELD OF THE INVENTION

The present invention relates to a photopolymerizable composition for forming a bezel pattern, a method for forming a bezel pattern using the same, a bezel pattern manufactured thereby, a display substrate comprising the bezel pattern, and a method of reworking for removing a poorly printed bezel pattern.

BACKGROUND OF THE INVENTION

Metal wiring for driving a device is located around OLED display substrate or LCD display substrate used for a TV, a monitor, and the like. Conventionally, a separate plastic casing serving as a bezel is provided on the outside of the substrate to cover the wiring. However, in recent years, a method of directly printing a bezel pattern on a substrate by using a printing method such as an ink jet is used instead of using a separate bezel structure in order to attain lightening and thinning.

The composition for a bezel printing allows for an inkjet process at a temperature close to room temperature, and can be processed only by light exposure at room temperature without a high temperature process so as not to affect a substrate and a display material. Particularly, a cationic photopolymerizable composition comprising a colorant, a cationic photopolymerizable monomer such as an epoxy compound, a diluting solvent, a photoinitiator and other additive is known to have excellent adhesion properties to a glass substrate (See, Korean Patent Application Nos. 10-2014-0072070 and 10-2015-0138094 by the present applicant).

When a printed matter is defective, generally the printed matter itself can be destroyed, but it is economically disadvantageous to destroy an expensive display substrate. Therefore, it is necessary to remove a poorly printed photopolymerizable composition on the display substrate and then recycle it. Since the photopolymerizable composition printed on the display substrate is in a liquid state, it is not difficult to remove it through ordinary solvent cleaning until immediately after printing and curing through an exposure process. However, there is a disadvantage that it is difficult to handle the display substrate in a state where the liquid composition is applied on four sides on a processing line requiring high cleanliness.

In addition, in order to shorten the processing time, it is generally preferable to carry out the defect inspection after completing all the printing and exposure processes, rather than inspecting the coating defect immediately after printing. Therefore, the bezel pattern that has been exposed and cured must be removed.

Since the bezel pattern formed from the cationic photopolymerizable composition according to the applications by the present applicant described above is based on an epoxy compound having excellent chemical resistance, it is difficult to remove the bezel pattern once it is cured. Generally, in order to remove the epoxy compound, a process of blending an abrasive or a method of immersing in a releasing agent which penetrates into the epoxy network structure may be used, but it may damage the display substrate. Therefore, the process or the method is difficult to use.

On the other hand, a free radical photopolymerizable composition based on an acrylic compound is easy to be removed even after curing. However, since the volume shrinkage during polymerization of the composition is large, a high-temperature heating process is essential for sufficient adhesion to a glass substrate of a display.

Accordingly, there is a need to develop a composition for manufacturing a bezel pattern which is easy to be removed even after curing, and which has a sufficient adhesion to a display substrate without requiring a high-temperature heating process.

SUMMARY OF THE INVENTION

An object of the present invention is to provide a photopolymerizable composition for manufacturing a bezel pattern which is excellent in adhesion to a display substrate and easy to be removed even after curing, a method for forming a bezel pattern using the same, a bezel pattern manufactured thereby, a display substrate comprising the bezel pattern, and a method of reworking for removing a poorly printed bezel pattern.

In order to achieve the above object, the present invention provides a photopolymerizable composition for forming a bezel pattern, comprising a colorant, an epoxy monomer, an oxetane monomer, a vinyl monomer, a cationic photopolymerization initiator, an adhesion promoter and a diluting solvent.

The present invention also provides a method of forming a bezel pattern, comprising: (a) forming a bezel pattern on a substrate using the photopolymerizable composition for forming a bezel pattern according to the present invention; and (b) curing the bezel pattern by irradiation with ultraviolet rays.

The present invention further provides a bezel pattern for a display substrate formed on a substrate by curing the photopolymerizable composition.

The present invention also provides a display substrate comprising the bezel pattern.

In addition, the present invention provides a method of reworking a bezel pattern, comprising removing a poorly printed pattern of the bezel patterns through cleaning using a solvent and a wiper.

Effect of the Invention

The photopolymerizable composition for forming a bezel pattern according to the present invention is a bezel ink developed for application to a bezel pattern of a display substrate. The bezel ink has excellent adhesion to a display substrate, excellent curing sensitivity and hardness, and easiness of removal when printing is defective.

BRIEF DESCRIPTION OF THE DRAWINGS

FIG. 1 is a photograph of a device for evaluating rework properties of a cured photopolymerizable composition.

FIG. 2A is a view showing the case in which most of the coat is peeled off within 50 times, and the case in which the coat is not completely peeled off at 50 times, when the coat is rubbed while moving the chuck forward/backward at a rate of 30 times per minute in the apparatus shown in FIG. 1.

FIG. 2B is a view showing the case in which the coat is not completely peeled off at 50 times when the coat is rubbed while moving the chuck forward/backward at a rate of 30 times per minute in the apparatus shown in FIG. 1.

DETAILED DESCRIPTION OF THE INVENTION

Hereinafter, the present invention will be described in more detail.

Since various modifications and variations can be made in the present invention, particular embodiments are illustrated in the drawings and will be described in detail in the detailed description. It should be understood, however, that the invention is not intended to be limited to the particular embodiments, but includes all modifications, equivalents, and alternatives falling within the spirit and scope of the invention. In the following description of the present invention, detailed description of known functions will be omitted if it is determined that it may obscure the gist of the present invention.

The photopolymerizable composition according to the present invention comprises a colorant, an epoxy monomer, an oxetane monomer, a vinyl monomer, a cationic photopolymerization initiator, a adhesion promoter and a diluting solvent.

The colorant comprises at least one black ink pigment selected from the group consisting of carbon black, graphite, metal oxides and organic black pigments.

Examples of carbon black include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF (Donghae Carbon Co., Ltd.); diagram black II, diagram black N339, diagram black SH, diagram black H, diagram LH, diagram HA, diagram SF, diagram N550M, diagram M, diagram E, diagram G, diagram R, diagram N760M, diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corporation); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, RAVEN-1170 (Columbia Carbon Co.), mixtures thereof, or the like.

The organic black pigment includes aniline black, lactam black, perylene black, and the like, but is not limited thereto.

The content of the colorant is 2 to 10% by weight, for example, 5 to 8% by weight based on the total weight of the photopolymerizable composition. When the content is less than 2% by weight, a level of optical density (OD) applicable to the bezel pattern may not be obtained. If it exceeds 10% by weight, an excessive amount of colorant may not be dispersed in the ink, so that precipitates may be formed.

The epoxy monomer is a cationic polymerizable monomer. Specifically, it may be at least one selected from a bisphenol type epoxy monomer, a novolac type epoxy monomer, a glycidyl ester type epoxy monomer, a glycidyl amine type epoxy monomer, a linear aliphatic epoxy monomer, a biphenyl type epoxy monomer, and an alicyclic epoxy monomer.

The alicyclic epoxy monomer may refer to a monomer containing at least one epoxidized aliphatic ring group.

In the alicyclic epoxy monomer containing the epoxidized aliphatic ring group(s), the epoxidized aliphatic ring group refers to an epoxy group bonded to an alicyclic ring. Examples thereof include a functional group such as a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl)ethyl group, a 2-(3,4-epoxycyclohexyl)ethyl group, a 3-(3,4-epoxycyclopentyl)propyl group or a 3-(3,4-epoxycyclohexyl)propyl group. The hydrogen atom constituting the alicyclic ring may be optionally substituted with a substituent such as an alkyl group. The alicyclic epoxy monomer includes the monomers specifically exemplified below, but is not limited to thereto.

There may be used, for example, dicyclopentadiene dioxide, cyclohexene oxide, 4-vinyl-1,2-epoxy-4-vinylcyclohexene, vinylcyclohexene dioxide, limonene monoxide, limonene dioxide, (3,4-epoxycyclohexyl)methyl-3,4-epoxycyclohexanecarboxylate, 3-vinylcyclohexene oxide, bis(2,3-epoxycyclopentyl)ether, bis(3,4-epoxycyclohexylmethyl)adipate, bis(3,4-epoxy-6-methylcyclohexylmethyl) adipate, (3,4-epoxycyclohexyl)methyl alcohol, (3,4-epoxy-6-methylcyclohexyl)methyl-3,4-epoxy-6-methylcyclohexanecarboxylate, ethylene glycol bis(3,4-epoxycyclohexyl)ether, 3,4-epoxycyclohexene carboxylic acid ethylene glycol diester, (3,4-epoxycyclohexyl)ethyltrimethoxysilane, limonene dioxide from Arkema, Celloxide 8000 and Celloxide 2021P from Daicel, YD-128 from Kukdo Chemical, and EPIOL-DE204 from Hajin Chemtech.

The content of the epoxy monomer may be 6 to 12% by weight, for example, 7.5 to 10.5% by weight based on the total weight of the photopolymerizable composition. If the content of the epoxy monomer exceeds 12% by weight, the viscosity of the ink composition increases to deteriorate the performance of the inkjet process. If the content of the epoxy monomer is less than 6% by weight, the curing sensitivity may be deteriorated.

The oxetane monomer may comprise a monofunctional oxetane monomer and a difunctional oxetane monomer as the cationic polymerizable monomer and may serve to lower the viscosity of the cationically cured ink composition (e.g., less than 50 cP at 25° C.).

In particular, there may be exemplified by 3-ethyl-3-hydroxymethyloxetane, bis[1-ethyl(3-oxetanyl)]methyl ether, 1,4-bis[(3-ethyl-3-oxetanyl)methoxymethyl]benzene, 3-ethyl-3-(phenoxymethyl)oxetane, di[(3-ethyl-3-oxetanyl) methyl]ether, 3-ethyl-3-[(2-ethylhexyloxy)methyl]oxetane, 3-ethyl-3-cyclohexyloxymethyl oxetane and phenol novolak oxatane. Examples of the oxetane monomer include "ARON OXETANE OXT-101", "ARON OXETANE OXT-121", "ARON OXETANE OXT-211", "ARON OXETANE OXT-221", "ARON OXETANE OXT-212" and the like from Toagosei Co., Ltd. These may be used in combination of two or more of an oxetane monomer having one oxetane ring and an oxetane monomer having two oxetane rings.

The content of the monofunctional oxetane monomer of the oxetane monomers is 3 to 12% by weight, for example, 5 to 10% by weight based on the total weight of the photopolymerizable composition.

In one embodiment, a weight ratio of the epoxy monomer: the oxetane monomer is 1:5 to 1:10.

As the vinyl monomer, for example, 4-hydroxybutyl vinyl ether, cyclohexane vinyl ether, diethylene glycol vinyl ether and triethylene glycol vinyl ether from BASF can be exemplified.

The content of the vinyl monomer is 4 to 12% by weight, for example, 6 to 10% by weight based on the total weight of the photopolymerizable composition.

The photopolymerization initiator is a cationic polymerizable initiator. Specifically, the photopolymerization initiator comprises a compound which produces a cationic species or a Bronsted acid by irradiation of UV rays, for example, at least one of an iodonium salt or a sulfonium salt. The iodonium salt or the sulfonium salt causes a curing reaction in which monomers having unsaturated double bond(s) contained in the composition are reacted to produce a polymer during UV curing process. As an example, the photopolymerization initiator may be a photopolymerization initiator having an anion represented by $SbF_6^-$, $AsF_6^-$, $BF_6^-$, $(C_6F_5)_4B^-$, $PF_6^-$ or $Rf_nF_6^{-n}$, but is not limited thereto. Commercially available products include Irgacure 250, Irgacure 270, Irgacure 290, CPI-100P, CPI-101A, CPI-2105, Omnicat 440, Omnicat 550 and Omnicat 650. These photopolymerization initiators may be used alone or in combination of two or more. In particular, in one embodiment of the present invention, the photopolymerization initiator may be Speedcure 920 (manufactured by Lamberti).

The content of the photopolymerization initiator is 1 to 10% by weight, for example 3 to 5% by weight based on the total weight of the photopolymerizable composition. If the content of the photopolymerization initiator is less than 1% by weight, the curing reaction may be insufficient, and if the content is more than 10% by weight, the initiator may not be dissolved completely or the viscosity of the ink composition may be increased and the inkjet processability may be deteriorated.

The adhesion promoter is used to improve the adhesion between the photopolymerizable composition and the display substrate. For example, 3-glycidyltrimethoxysilane from Evonik can be used.

The adhesion promoter is contained in an amount of 1 to 4% by weight, for example, 2 to 3% by weight based on the total weight of the photopolymerizable composition. If the content of the adhesion promoter is less than 1% by weight, adhesion between the substrate and the printing layer may be deteriorated, and if the content is more than 4% by weight, stability and curing sensitivity of the ink may be deteriorated.

The diluting solvent can be used without particular limitation as long as it has excellent curing sensitivity even after printing the bezel pattern on the display substrate using the photopolymerizable composition according to the present invention. Examples of the solvent include organic solvents such as diethylene glycol, propylene glycol methyl ether, ethylene glycol monobutyl ether acetate, methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate.

The content of the diluting solvent is 10 to 30% by weight, for example, 15 to 20% by weight based on the total weight of the photopolymerizable composition. If the content of the solvent is less than 10% by weight, the viscosity of the ink may be increased and the thickness of the bezel layer may become thick, and if the content is more than 30% by weight, the curing sensitivity may be lowered.

In addition, the photopolymerizable composition according to the present invention may further comprise at least one selected from the group consisting of a surfactant, a photosensitizer and a photostabilizer, if necessary.

The surfactant adjusts the surface tension of the ink so that jetting can be smoothly performed, and the ink spreads properly on the display substrate. As the surfactant, there may be exemplified by Megafack F-444, F-475, F-478, F-479, F-484, F-550, F-552, F-553, F-555, F-570 and RS-75 from DIC (DaiNippon Ink & Chemicals), or Surflon S-111, S-112, S-113, S-121, S-131, S-132, S-141 and S-145 from Asahi Glass Co., Ltd., or Fluorad FC-93, FC-95, FC-98, FC-129, FC-135, FC-170C, FC-430 and FC-4430 from Sumitomo 3M Co., Ltd., or Zonyl FS-300, FSN, FSN-100 and FSO from DuPont, or BYK-306, BYK-310, BYK-320, BYK-331, BYK-333, BYK-342, BYK-350, BYK-354, BYK-355, BYK-356, BYK-358N, BYK-359, BYK-361N, BYK-381, BYK-370, BYK-371, BYK-378, BYK-388, BYK-392, BYK-394, BYK-399, BYK-3440, BYK-3441, BYK-UV 3500, BYK-UV 3530, BYK-UV 3570, BYKE-TOL-AQ, BYK-DYNWET 800, BYK-SILCLEAN 3700 and BYK-UV 3570 from BYK, or Rad 2100, Rad 2011, Glide 100, Glide 410, Glide 450, Flow 370 and Flow 425 from TEGO, etc. These may be used singly or in combination of two or more.

If the surfactant is contained in the photopolymerizable composition, the content thereof is 0.1 to 5% by weight, for example, 0.5 to 3% by weight based on the total weight of the photopolymerizable composition. If the content of the surfactant is less than 0.1% by weight, the effect of lowering the surface tension of the composition may be insufficient, resulting in coating failure when the composition is coated on the substrate. If the content is more than 5.0% by weight, the surfactant may be used in an excessive amount, resulting in a problem that the compatibility and the defoaming property of the composition may be reduced.

The photosensitizer may be, for example, 9,10-diethoxyanthracene from Sigma-Aldrich, and may be contained in an amount of 1 to 3% by weight, for example, 2% by weight based on the total weight of the photopolymerizable composition.

The content of the photostabilizer may be 1 to 3% by weight based on the total weight of the photopolymerizable composition.

The photopolymerizable composition of the present invention spreads within a short time after inkjet printing, exhibits excellent coating properties, and exhibits excellent adhesion properties by curing. Therefore, when the photopolymerizable composition is applied to an inkjet printer, it is preferable to provide a UV lamp just behind the inkjet head so that curing can be performed simultaneously with inkjet printing.

The photopolymerizable composition has an exposure dose for curing of 1 mJ/cm$^2$ to 10,000 mJ/cm$^2$, preferably 1,000 mJ/cm$^2$ to 3,000 mJ/cm$^2$.

The photopolymerizable composition is cured by absorbing radiation in a wavelength range of 250 nm to 450 nm, preferably 360 nm to 410 nm.

The photopolymerizable composition, for example, having a viscosity of 1 cP to 50 cP at 25° C., preferably 3 cP to 45 cP at 25° C. is suitable for an inkjet process. The photopolymerizable composition having the above-described viscosity range has good jetting at a process temperature. The process temperature means a temperature heated in order to lower viscosity of the photopolymerizable composition. The process temperature may be from 10° C. to 100° C., and preferably from 20° C. to 70° C.

The photopolymerizable composition has a taper angle of 0° to 30°, preferably 0° to 10° after curing.

A method of forming a bezel pattern for a display substrate of the present invention includes: (a) forming a bezel pattern on a substrate using the photopolymerizable composition; and (b) curing the bezel pattern by irradiation with ultraviolet rays.

The method of manufacturing a bezel pattern for a display substrate of the present invention may further comprises cleaning and drying the substrate before forming the bezel pattern. This is for selectively performing the surface treatment depending on the surface energy of the substrate to improve coatability of the ink and remove stains by foreign substances.

Specifically, the surface treatment can be carried out by a treatment such as wet surface treatment, UV ozone, atmospheric plasma or the like.

As a method of forming a bezel pattern on the substrate, a method selected from inkjet printing, gravure coating and reverse offset coating may be used instead of photolithography and screen printing.

The forming the bezel pattern may be performed at a processing temperature of 10° C. to 100° C., and the curing the bezel pattern may be performed by absorbing radiation in a wavelength range of 250 nm to 450 nm.

In this way, the photopolymerizable composition having a low viscosity of 1 cP to 50 cP is applied to form the bezel pattern on a specific portion of the substrate. The applied composition is cured through exposure using ultraviolet rays, so that a bezel pattern having a thin film thickness of 0.1 μm to 20 μm, more specifically 0.5 μm to 5 μm can be produced.

Examples of the light source for curing the photopolymerizable composition of the present invention include mercury vapor arc, carbon arc, Xe arc and LED curing machine which emit light having a wavelength of 250 to 450 nm, but are not limited thereto.

The bezel pattern may have, as measured after curing, a taper angle of 0° to 30°, a thickness of 0.1 μm to 20 μm, and a viscosity of 1 cP to 50 cP. In addition, the taper angle may preferably be 0° to 10°, and the thickness may preferably be 0.5 μm to 5 μm, and the viscosity may preferably be 1 cP to 20 cP. The bezel pattern of the present invention may not exhibit short-circuit due to a large step, bubble generation, and deterioration of visual quality due to film release.

The optical density (OD) of the bezel pattern may be 0.05 to 2.5 on the basis of the film thickness of 1.0 μm, or 0.1 to 1.5, if necessary. In this case, there is an advantage that the shielding properties by the bezel pattern are excellent. If the optical density exceeds 2.5, the required content of the pigment to be added becomes very high, which may adversely affect the production of the ink and the inkjet process and may inhibit the photopolymerizable composition from being cured by radiation.

The present invention provides a bezel pattern of display substrate manufactured by the above method. In the present invention, the bezel pattern refers to a pattern formed at the edges of various devices such as a watch, a display device, and the like.

Among the bezel patterns thus manufactured, the poorly printed bezel pattern can be removed by cleaning using at least one solvent selected from acetone, dimethylformamide (DMF), diethylformamide (DEF), N-methylpyrrolidone (NMP), N-ethylpyrrolidone, methyl alcohol, ethyl alcohol, isopropyl alcohol, n-propyl alcohol, n-butyl alcohol, isobutyl alcohol, methyl ethyl ketone, methyl isobutyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate, and a wiper.

The curing sensitivity of the bezel pattern formed according to the present invention is the state in which the surface of the coating film is non-sticky after curing within an exposure dose of 3000 mJ/cm$^2$ in the evaluation using 395 nm UV-LED.

The bezel pattern formed according to the present invention has a hardness of 1H or more in the evaluation using a pencil hardness meter. The bezel pattern formed in accordance with the present invention is such that an adhesive to the substrate is at least 4B in the test according to ASTM D3359 standard within 10 minutes after exposure.

The present invention also provides a display substrate comprising the bezel pattern. The display may be used in any one selected from a plasma display panel (PDP), a light emitting diode (LED), an organic light emitting diode (OLED), a liquid crystal display (LCD), a thin film transistor-liquid crystal display (LCD-TFT) and a cathode ray tube (CRT).

In addition, the present invention provides a method of reworking a bezel pattern comprising removing a poorly printed pattern of the bezel patterns through cleaning using a solvent and a wiper.

In the reworking method, the solvent may be at least one selected from the group consisting of acetone, dimethylformamide (DMF), diethylformamide (DEF), N-methylpyrrolidone (NMP), N-ethylpyrrolidone, methyl alcohol, ethyl alcohol, isopropyl alcohol, n-propyl alcohol, n-butyl alcohol, isobutyl alcohol, methyl ethyl ketone, methyl isobutyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate.

It will be apparent to those skilled in the art that various modifications and variations can be made in the present invention without departing from the spirit or scope of the invention as set forth in the appended claims. Such changes and modifications are intended to be within the scope of the appended claims.

Preparation of cationic photopolymerizable compositions is disclosed in the Examples and the Comparative Examples below.

Example 1

As shown in the following Table 1, with respect to the total weight of the cationic photopolymerizable composition, 5% by weight of C.I. Pigment Black 7, 10% by weight of limonene dioxide (Arkema), 41% by weight of ARON OXETANE 101 (TOAGOSEI CO., LTD.), 9% by weight of ARON OXETANE 212 (TOAGOSEI CO., LTD.), 10% by weight of 4-hydroxybutyl vinyl ether (BASF) and 15% by weight of diethylene glycol (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 3% by weight of 3-glycidyltrimethoxysilane (Evonik) were added to the reactor and stirred at room temperature for 24 hours to prepare a cationic photopolymerizable composition of the present invention.

Example 2

As shown in the following Table 1, with respect to the total weight of the cationic photopolymerizable composition, 5% by weight of C.I. Pigment Black 7, 10% by weight of Celloxide 2021P (Daicel), 45% by weight of ARON OXETANE 221 (TOAGOSEI CO., LTD.), 7.5% by weight of ARON OXETANE 212 (TOAGOSEI CO., LTD.), 8% by weight of cyclohexane vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of the present invention.

Example 3

As shown in the following Table 1, with respect to the total weight of the cationic photopolymerizable composition, 5% by weight of C.I. Pigment Black 7, 7.5% by weight of Celloxide 2021P (Daicel), 45.5% by weight of ARON OXETANE 221 (TOAGOSEI CO., LTD.), 7.5% by weight of ARON OXETANE 212 (TOAGOSEI CO., LTD.), 10% by weight of diethylene glycol vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of the present invention.

Example 4

As shown in the following Table 1, with respect to the total weight of the cationic photopolymerizable composition, 5% by weight of C.I. Pigment Black 7, 10% by weight of Celloxide 8000 (Daicel), 44.5% by weight of ARON OXETANE 101 (TOAGOSEI CO., LTD.), 6% by weight of ARON OXETANE 212 (TOAGOSEI CO., LTD.), 10% by weight of triethylene glycol vinyl ether (BASF) and 15% by weight of propylene glycol methyl ether (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of the present invention.

Example 5

As shown in the following Table 1, with respect to the total weight of the cationic photopolymerizable composition, 5% by weight of C.I. Pigment Black 7, 9% by weight of YD-128 (Kukdo Chemical), 45% by weight of ARON OXETANE 221 (TOAGOSEI CO., LTD.), 5% by weight of ARON OXETANE 212 (TOAGOSEI CO., LTD.), 6% by weight of triethylene glycol vinyl ether (BASF) and 20% by weight of propylene glycol methyl ether (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 3% by weight of 3-glycidyltrimethoxysilane (Evonik) were added to the reactor and stirred at room temperature for 24 hours to prepare a cationic photopolymerizable composition of the present invention.

Example 6

As shown in the following Table 1, with respect to the total weight of the cationic photopolymerizable composition, 5% by weight of C.I. Pigment Black 7, 9% by weight of EPIOL-DE204 (Hajin Chemtech. co. ltd.), 45% by weight of ARON OXETANE 221 (TOAGOSEI CO., LTD.), 5% by weight of ARON OXETANE 212 (TOAGOSEI CO., LTD.), 6% by weight of triethylene glycol vinyl ether (BASF) and 20% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 3% by weight of 3-glycidyltrimethoxysilane (Evonik) were added to the reactor and stirred at room temperature for 24 hours to prepare a cationic photopolymerizable composition of the present invention.

Example 7

As shown in the following Table 1, with respect to the total weight of the cationic photopolymerizable composition, 2.5% by weight of C.I. Pigment Black 7, 6% by weight of YD-128 (Kukdo Chemical), 49% by weight of ARON OXETANE 221 (TOAGOSEI CO., LTD.), 7.5% by weight of ARON OXETANE 212 (TOAGOSEI CO., LTD.), 10% by weight of cyclohexane vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 3% by weight of 3-glycidyltrimethoxysilane (Evonik) were added and stirred at room temperature for 24 hours to prepare a cationic photopolymerizable composition of the present invention.

Example 8

As shown in the following Table 1, with respect to the total weight of the cationic photopolymerizable composition, 7.5% by weight of C.I. Pigment Black 7, 10% by weight of YD-128 (Kukdo Chemical), 42.5% by weight of ARON OXETANE 221 (TOAGOSEI CO., LTD.), 5.5% by weight of ARON OXETANE 212 (TOAGOSEI CO., LTD.), 10% by weight of cyclohexane vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of the present invention.

Comparative Example 1

As shown in the following Table 2, with respect to the total weight of the cationic photopolymerizable composition, 7.5% by weight of C.I. Pigment Black 7, 13.5% by weight of Celloxide 2021P (Daicel), 40% by weight of ARON OXETANE 221 (TOAGOSEI CO., LTD.), 5% by weight of ARON OXETANE 212 (TOAGOSEI CO., LTD.), 9.5% by weight of cyclohexane vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of Comparative Example 1.

Comparative Example 2

As shown in the following Table 2, with respect to the total weight of the cationic photopolymerizable composition, 7.5% by weight of C.I. Pigment Black 7, 13.5% by

TABLE 1

| Composition (% by weight) | Exam. 1 | Exam. 2 | Exam. 3 | Exam. 4 | Exam. 5 | Exam. 6 | Exam. 7 | Exam. 8 |
|---|---|---|---|---|---|---|---|---|
| Black pigment (C.I. Pigment Black 7) | 5 | 5 | 5 | 5 | 5 | 5 | 2.5 | 7.5 |
| Epoxy monomer (Limonene dioxide, Arkema) | 10 | | | | | | | |
| Epoxy monomer (Celloxide 2021P, Daicel) | | 10 | 7.5 | | | | | |
| Epoxy monomer (Celloxide 8000, Daicel) | | | | 10 | | | | |
| Epoxy monomer (YD-128, Kukdo Chemical) | | | | | 9 | | 6 | 10 |
| Epoxy monomer (EPIOL-DE204, Hajin Chemtech) | | | | | | 9 | | |
| Oxetane monomer (ARON OXETANE OXT-101, TOAGOSEI) | 41 | | | 44.5 | | | | |
| Oxetane monomer (ARON OXETANE OXT-221, TOAGOSEI) | | 45 | 45.5 | | 45 | 45 | 49 | 42.5 |
| Oxetane monomer (ARON OXETANE OXT-212, TOAGOSEI) | 9 | 7.5 | 7.5 | 6 | 5 | 5 | 7.5 | 5.5 |
| Vinyl monomer (4-hydroxybutyl vinyl ether, BASF) | 10 | | | | | | | |
| Vinyl monomer (Cyclohexane vinyl ether, BASF) | | 8 | | | | | 10 | 10 |
| Vinyl monomer (Diethylene glycol vinyl ether, BASF) | | | 10 | | | | | |
| Vinyl monomer (Triethylene glycol vinyl ether, BASF) | | | | 10 | 6 | 6 | | |
| Diethylene glycol (DUKSAN PURE CHEMICALS) | 15 | | | | | | | |
| Propylene glycol methyl ether (DUKSAN PURE CHEMICALS) | | | | 15 | 20 | | | |
| Ethylene glycol butyl ether acetate (DUKSAN PURE CHEMICALS) | | 15 | 15 | | | 20 | 15 | 15 |
| Photopolymerization initiator (Speedcure 920, Lamberti) | 5 | 5 | 5 | 5 | 5 | 5 | 5 | 5 |
| Photosensitizer (9,10-diethoxyanthracene, Sigma-Aldrich) | 2 | 2 | 2 | 2 | 2 | 2 | 2 | 2 |
| Adhesion promoter (3-glycidyltrimethoxysilane, Evonik) | 3 | 2.5 | 2.5 | 2.5 | 3 | 3 | 3 | 2.5 | weight of EPIOL-DE204 (Hajin Chemtech. co. ltd.), 40% by weight of ARON OXETANE 221 (TOAGOSEI CO., LTD.), 5% by weight of ARON OXETANE 212 (TOAGOSEI CO., LTD.), 9.5% by weight of cyclohexane vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of Comparative Example 2.

Comparative Example 3

As shown in the following Table 2, with respect to the total weight of the cationic photopolymerizable composition, 7.5% by weight of C.I. Pigment Black 7, 5% by weight of Celloxide 2021P (Daicel), 50% by weight of ARON OXETANE 221 (TOAGOSEI CO., LTD.), 5% by weight of ARON OXETANE 212 (TOAGOSEI CO., LTD.), 8% by weight of triethylene glycol vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of Comparative Example 3.

Comparative Example 4

As shown in the following Table 2, with respect to the total weight of the cationic photopolymerizable composition, 10% by weight of C.I. Pigment Black 7, 10% by weight of Celloxide 8000 (Daicel), 55% by weight of ARON OXETANE 221 (TOAGOSEI CO., LTD.), 15% by weight of propylene glycol methyl ether (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 3% by weight of 3-glycidyltrimethoxysilane (Evonik) were added to the reactor and stirred at room temperature for 24 hours to prepare a cationic photopolymerizable composition of Comparative Example 4.

Comparative Example 5

As shown in the following Table 2, with respect to the total weight of the cationic photopolymerizable composition, 10% by weight of C.I. Pigment Black 7, 10% by weight of Celloxide 8000 (Daicel), 40% by weight of ARON OXETANE 221 (TOAGOSEI CO., LTD.), 15% by weight of ARON OXETANE 212 (TOAGOSEI CO., LTD.) and 15% by weight of propylene glycol methyl ether (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 3% by weight of 3-glycidyltrimethoxysilane (Evonik) were added to the reactor and stirred at room temperature for 24 hours to prepare a cationic photopolymerizable composition of Comparative Example 5.

Comparative Example 6

As shown in the following Table 2, with respect to the total weight of the cationic photopolymerizable composition, 5% by weight of C.I. Pigment Black 7, 10% by weight of Celloxide 2021P (Daicel), 42.5% by weight of ARON OXETANE 101 (TOAGOSEI CO., LTD.), 10% by weight of ARON OXETANE 212 (TOAGOSEI CO., LTD.), 12.5% by weight of triethylene glycol vinyl ether (BASF) and 10.5% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of Comparative Example 6.

Comparative Example 7

As shown in the following Table 2, with respect to the total weight of the cationic photopolymerizable composition, 5% by weight of C.I. Pigment Black 7, 10% by weight of Celloxide 2021P (Daicel), 42.5% by weight of ARON OXETANE 101 (TOAGOSEI CO., LTD.), 10% by weight of ARON OXETANE 212 (TOAGOSEI CO., LTD.), 12.5% by weight of diethylene glycol vinyl ether (BASF) and 10.5% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 2.5% by weight of 3-glycidyltrimethoxysilane (Evonik) were added to the reactor and stirred at room temperature for 24 hours to prepare a cationic photopolymerizable composition of Comparative Example 7.

Comparative Example 8

As shown in the following Table 2, with respect to the total weight of the cationic photopolymerizable composition, 10% by weight of C.I. Pigment Black 7, 10% by weight of Celloxide 2021P (Daicel), 47.5% by weight of ARON OXETANE 101 (TOAGOSEI CO., LTD.), 10% by weight of ARON OXETANE 212 (TOAGOSEI CO., LTD.), 2.5% by weight of cyclohexane vinyl ether (BASF) and 10% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 3% by weight of 3-glycidyltrimethoxysilane (Evonik) were added to the reactor and stirred at room temperature for 24 hours to prepare a cationic photopolymerizable composition of Comparative Example 8.

Comparative Example 9

As shown in the following Table 2, with respect to the total weight of the cationic photopolymerizable composition, 5% by weight of C.I. Pigment Black 7, 7.5% by weight of Celloxide 2021P (Daicel), 45% by weight of ARON OXETANE 221 (TOAGOSEI CO., LTD.), 10% by weight of ARON OXETANE 212 (TOAGOSEI CO., LTD.), 10% by weight of 4-hydroxybutyl vinyl ether (BASF) and 15% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 0.5% by weight of 3-glycidyltrimethoxysilane (Evonik) were added to the reactor and stirred at room temperature for 24 hours to prepare a cationic photopolymerizable composition of Comparative Example 9.

Comparative Example 10

As shown in the following Table 2, with respect to the total weight of the cationic photopolymerizable composition, 5% by weight of C.I. Pigment Black 7, 7.5% by weight of Celloxide 2021P (Daicel), 45% by weight of ARON OXETANE 221 (TOAGOSEI CO., LTD.), 10% by weight of ARON OXETANE 212 (TOAGOSEI CO., LTD.), 10% by weight of 4-hydroxybutyl vinyl ether (BASF) and 10.5% by weight of ethylene glycol butyl ether acetate (DUKSAN PURE CHEMICALS CO., LTD.) were added to the reactor and reacted for 6 hours. Then, 5% by weight of Speedcure 920 (Lamberti), 2% by weight of 9,10-diethoxyanthracene (Sigma-Aldrich) and 5% by weight of 3-glycidyltrimethoxysilane (Evonik) were added to the reactor and stirred at room temperature for 24 hours to prepare a cationic photopolymerizable composition of Comparative Example 10.

In Table 2 below, numerical values that are out of the range of the content of the epoxy monomer, the content of the ARON OXETANE 212 in the oxetane monomer, the content of the vinyl monomer and the content of the adhesion promoter according to the present invention are underlined.

TABLE 2

| Composition (% by weight) | Comp. Exam 1 | Comp. Exam 2 | Comp. Exam 3 | Comp. Exam 4 | Comp. Exam 5 | Comp. Exam 6 | Comp. Exam 7 | Comp. Exam 8 | Comp. Exam 9 | Comp. Exam 10 |
|---|---|---|---|---|---|---|---|---|---|---|
| Black pigment (C.I. Pigment Black 7) | 7.5 | 7.5 | 7.5 | 10 | 10 | 5 | 5 | 10 | 5 | 5 |
| Epoxy monomer (Limonene dioxide, Arkema) | | | | | | | | | | |
| Epoxy monomer (Celloxide 2021P, Daicel) | _13.5_ | | _5_ | | | 10 | 10 | 10 | 7.5 | 7.5 |
| Epoxy monomer (Celloxide 8000, Daicel) | | | | 10 | 10 | | | | | |
| Epoxy monomer (YD-128, Kukdo Chemical) | | | | | | | | | | |
| Epoxy monomer (EPIOL-DE204, Hajin Chemtech) | | _13.5_ | | | | | | | | |
| Oxetane monomer (ARON OXETANE OXT-101, TOAGOSEI) | | | | | | 42.5 | 42.5 | 7.5 | | |
| Oxetane monomer (ARON OXETANE OXT-221, TOAGOSEI) | 40 | 40 | 50 | 55 | 40 | | | | 45 | 45 |
| Oxetane monomer (ARON OXETANE OXT-212, TOAGOSEI) | 5 | 5 | 5 | _0_ | _15_ | 10 | 10 | 10 | 10 | 10 |
| Vinyl monomer (4-hydroxybutyl vinyl ether, BASF) | | | | | | | | | 10 | 10 |
| Vinyl monomer (Cyclohexane vinyl ether, BASF) | 9.5 | 9.5 | | | | | | | _2.5_ | |
| Vinyl monomer (Diethylene glycol vinyl ether, BASF) | | | | | | | | _12.5_ | | |
| Vinyl monomer (Triethylene glycol vinyl ether, BASF) | | | 8 | | | | _12.5_ | | | |
| Diethylene glycol (DUKSAN PURE CHEMICALS) | | | | | | | | | | |
| Propylene glycol methyl ether (DUKSAN PURE CHEMICALS) | | | | 15 | 15 | | | | | |
| Ethylene glycol butyl ether acetate (DUKSAN PURE CHEMICALS) | 15 | 15 | 15 | | | 10.5 | 10.5 | 10 | 15 | 10.5 |
| Photopolymerization initiator (Speedcure 920, Lamberti) | 5 | 5 | 5 | 5 | 5 | 5 | 5 | 5 | 5 | 5 |
| Photosensitizer (9,10-diethoxyanthracene, Sigma-Aldrich) | 2 | 2 | 2 | 2 | 2 | 2 | 2 | 2 | 2 | 2 |
| Adhesion promoter (3-glycidyltrimethoxysilane, Evonik) | 2.5 | 2.5 | 2.5 | 3 | 3 | 2.5 | 2.5 | 3 | _0.5_ | _5_ |

Experimental Examples 1 to 4: Evaluation of Properties of Specimens Prepared with Cationic Photopolymerizable Compositions The curing sensitivity, reworkability, pencil hardness and adhesiveness of the cationic photopolymerizable compositions prepared in Examples 1 to 8 and Comparative Examples 1 to 10 were evaluated as follows. The results for the compositions of Examples 1 to 8 are shown in Table 3 below, and the results for the compositions of Comparative Examples 1 to 10 are shown in Table 4 below.

Experimental Example 1: Curing Sensitivity

A glass substrate for display (EAGLE XG, Corning) was chamfered to a size of 100 mm×100 mm, immersed in acetone, isopropyl alcohol and ultrapure water in order for 5 minutes, respectively, to perform ultrasonic cleaning, followed by drying at 120° C. for 30 minutes. 1 mL each of the cationic photopolymerizable compositions prepared in Examples 1 to 8 and Comparative Examples 1 to 10 was dropped onto the glass substrate. Then, a film was formed to a thickness of about 5 μm using a Meyer bar and then cured using a UV-LED curing machine (wavelength: 395 nm, 1000 mW/cm$^2$). According to the time taken until the greasy or sticky unreacted materials do not remain on the surface of the coating film, The case where the surface of the coating film is fully cured after exposure for 1 second (exposure dose: 1000 mJ/cm$^2$) was evaluated as A, the case where the surface of the coating film is fully cured after exposure for 3 seconds (exposure dose: 3000 mJ/cm$^2$) was evaluated as B, and the case where exposure for 3 seconds or more is required was evaluated as C. The evaluations A and B represent good results.

Experimental Example 2: Reworkability

The coating films produced from the cationic photopolymerizable compositions in Examples 1 to 8 and Comparative Examples 1 to 10, prepared in Experimental Example 1, were compared in terms of cleanability by solvents using an abrasion resistance tester 100 (Fastness Rubbing Tester, KIPAE). As shown in FIG. 1, a nonwoven fabric wiper 102 was attached to a test chuck 104, and a weight (106) of 2000 g was attached thereto. Upon tuning on the equipment after spraying the solvent on the wiper, the chuck moved forward and backward (108) at a rate of 30 times per minute on a substrate 110, and thus the coating film 112 was rubbed and removed. As a solvent, dimethylformamide (DMF) and NMP, which have good removal ability but have human health hazards, and acetone and ethyl alcohol, which are less harmful to human body, were used. The case where most of the coating film is peeled off within 20 times was evaluated as A, the case where most of the coating film is peeled off within 50 times was evaluated as B, and the case where the coating film is not completely peeled off at the time of 50 times was evaluated as C. The case where most of the coating film is peeled off within 50 times and the case where the coating film is not completely peeled off at the time of 50 times can be confirmed from the photographs of FIGS. 2A-B. The evaluation A represents a good result.

Experimental Example 3: Pencil Hardness

The coating films produced from the cationic photopolymerizable compositions in Examples 1 to 8 and Comparative Examples 1 to 10, prepared in Experimental Example 1, were evaluated using a pencil hardness tester (KIPAE). Each sample was evaluated at a room temperature for 1 day. The hardness of the film was recorded as 4B to 2H as scratches occurred based on the hardness value of the pencil used in the test. 1H or more is evaluated as a good result.

Experimental Example 4: Adhesiveness

The coating films produced from the cationic photopolymerizable compositions in Examples 1 to 8 and Comparative Examples 1 to 10, prepared in Experimental Example 1, were evaluated as 0B to 5B by the test according to the ASTM D3359 standard within 10 minutes after exposure. 4B or more is evaluated as a good result.

TABLE 3

|  |  | Exam 1 | Exam 2 | Exam 3 | Exam 4 | Exam 5 | Exam 6 | Exam 7 | Exam 8 |
|---|---|---|---|---|---|---|---|---|---|
| Curing sensitivity |  | A | A | A | A | B | B | B | A |
| Reworkability | Ethyl alcohol | B | A | A | B | A | B | A | A |
|  | Acetone | A | A | A | A | A | A | A | A |
|  | NMP | A | A | A | A | A | A | A | A |
|  | DMF | A | A | A | A | A | A | A | A |
| Pencil hardness |  | 2H | 2H | 1H | 1H | 2H | 2H | 2H | 2H |
| Adhesiveness |  | 4B | 4B | 4B | 4B | 4B | 4B | 4B | 4B |

TABLE 4

|  |  | Comp Exam 1 | Comp Exam 2 | Comp Exam 3 | Comp Exam 4 | Comp Exam 5 | Comp Exam 6 | Comp Exam 7 | Comp Exam 8 | Comp Exam 9 | Comp Exam 10 |
|---|---|---|---|---|---|---|---|---|---|---|---|
| Curing sensitivity |  | A | A | C | A | B | A | A | C | B | B |
| Reworkability | Ethyl alcohol | C | B | B | C | B | A | A | B | C | C |
|  | Acetone | B | B | A | C | A | A | A | B | A | C |
|  | NMP | B | B | A | B | A | A | A | B | A | B |
|  | DMF | B | A | A | A | A | A | A | A | A | A |
| Pencil hardness |  | 2H | 2H | HB | 2H | 2B | 4B | 2B | HB | 1B | 2H |
| Adhesiveness |  | 4B | 4B | 2B | 4B | 4B | 4B | 4B | 4B | 1B | 5B |

Evaluation Results

From the results shown in Tables 3 and 4, the compositions of Examples 1 to 8 according to the present invention has curing sensitivity of B or more, pencil hardness of 1H or more, and adhesiveness of 4B or more. Also, for the reworkability, only three cases among results for ethyl alcohol are shown as B and the others are shown as A. Therefore, it can be confirmed that the composition according to the present invention has suitable properties.

On the contrary, the compositions of Comparative Examples 1 and 2 exhibit the reworkability of B or C because the epoxy monomer was introduced in an excessive amount of 13.5% by weight, resulting in insufficient reworkability. In Comparative Example 3 in which the epoxy monomer was introduced in an amount as low as 5% by weight, curing sensitivity was insufficient as C, and pencil hardness and adhesiveness were also poor as HB and 2B, respectively.

In Comparative Example 4 in which ARON OXETANE 212 was not introduced, the reworkability in the case of ethyl alcohol and acetone was poor as C. In Comparative Example 5 in which ARON OXETANE 212 was introduced in an excessive amount of 15% by weight, curing sensitivity was slightly decreased and pencil hardness was poor as 2B.

In Comparative Examples 6 and 7 in which the vinyl monomer was introduced in an excess amount of 12.5% by weight, pencil hardness was drastically reduced to 4B and 2B, respectively. In Comparative Example 8 in which the vinyl monomer was introduced in an amount as low as 2.5% by weight, curing sensitivity was poor as C, reworkability in the case of ethyl alcohol, acetone and NMP was insufficient as B, and pencil hardness was insufficient as HB.

In Comparative Example 9 in which alkoxysilane was introduced in an amount as low as 0.5% by weight, reworkability in the case of ethyl alcohol was poor as C, pencil hardness was insufficient as 1B and adhesiveness was poor as 1B. However, in Comparative Example 10 in which alkoxysilane was introduced in an excess amount of 5% by weight, reworkability in the case of ethyl alcohol and acetone was poor as C.

In summary, the photopolymerizable composition comprising the epoxy monomer, the monofunctional oxetane monomer, the vinyl monomer, and the adhesion promoter in a specific amount range according to the present invention provides a coating film having good curing sensitivity after curing, reworkability, pencil strength and adhesiveness.

While the present invention has been particularly shown and described with reference to the particular embodiments thereof, it will be apparent to those skilled in the art that these specific descriptions are only preferred embodiments and that the scope of the invention is not limited thereby. Accordingly, the actual scope of the present invention will be defined by the appended claims and their equivalents.

What is claimed is:

1. A photopolymerizable composition for forming a bezel pattern, comprising a colorant, an epoxy monomer, a monofunctional oxetane monomer, a difunctional oxetane monomer, a vinyl monomer, a cationic photopolymerization initiator, an adhesion promoter and a diluting solvent, and
wherein the monofunctional oxetane monomer is present in an amount of 5 to 10% by weight based on the total weight of the photopolymerizable composition.

2. The photopolymerizable composition according to claim 1, further comprising:
at least one selected from the group consisting of a surfactant, a photosensitizer and a photo stabilizer.

3. The photopolymerizable composition according to claim 1, wherein the epoxy monomer is present in an amount of 7.5 to 10.5% by weight based on the total weight of the photopolymerizable composition.

4. The photopolymerizable composition according to claim 1, wherein the vinyl monomer is present in an amount of 6 to 10% by weight based on the total weight of the photopolymerizable composition.

5. The photopolymerizable composition according to claim 1, wherein the adhesion promoter is present in an amount of 2 to 3% by weight based on the total weight of the photopolymerizable composition.

6. A method of forming a bezel pattern for a display substrate, comprising:
patterning the photopolymerizable composition according to claim 1 in the form of a bezel pattern; and
(b) curing the bezel pattern by irradiation with ultraviolet radiation.

7. The method of forming a bezel pattern according to claim 6, wherein the bezel pattern is formed on the substrate by one of inkjet printing, gravure coating or reverse offset coating.

8. The method of forming a bezel pattern according to claim 6, wherein the bezel pattern is formed on the substrate at a processing temperature of 10° C. to 100° C.

9. The method of forming a bezel pattern according to claim 6, wherein the bezel pattern is cured by absorbing radiation in a wavelength range of 250 nm to 450 nm.

10. The method of forming a bezel pattern according to claim 6, wherein the thickness of the cured bezel pattern is 0.1 μm to 20 μm.

11. A bezel pattern for a display substrate formed by patterning and curing the photopolymerizable composition of claim 1.

12. The bezel pattern according to claim 11, wherein the thickness of the bezel pattern is 0.1 μm to 20 μm.

13. The bezel pattern according to claim 11, wherein the taper angle of the bezel pattern is 0° to 30°.

14. The bezel pattern according to claim 11, wherein the optical density (OD) of the bezel pattern is 0.1 to 1.5 on the basis of the film thickness of 1.0 μm.

15. The bezel pattern according to claim 11, wherein a poorly printed bezel pattern is removed by cleaning using at least one solvent selected from acetone, dimethylformamide (DMF), diethylformamide (DEF), N-methylpyrrolidone (NMP), N-ethylpyrrolidone, methyl alcohol, ethyl alcohol, isopropyl alcohol, n-propyl alcohol, n-butyl alcohol, isobutyl alcohol, methyl ethyl ketone, methyl isobutyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate, and a wiper.

16. The bezel pattern according to claim 11, wherein the hardness of the bezel pattern is 1H or more in the evaluation using a pencil hardness meter.

17. The bezel pattern according to claim 11, wherein the bezel pattern has an adhesion to the substrate of at least 4B in the test according to ASTM D3359 standard within 10 minutes after exposure.

18. A display substrate comprising the bezel pattern according to claim 11.

19. A method of reworking a bezel pattern, comprising:
removing a poorly printed bezel pattern from the substrate according to claim 18 by applying a solvent and a wiping the poorly printed bezel pattern from the substrate with a wiper.

20. The method of reworking a bezel pattern according to claim 19, wherein the solvent is at least one selected from the group consisting of acetone, dimethylformamide (DMF), diethylformamide (DEF), N-methylpyrrolidone (NMP), N-ethylpyrrolidone, methyl alcohol, ethyl alcohol, isopropyl alcohol, n-propyl alcohol, n-butyl alcohol, isobutyl alcohol, methyl ethyl ketone, methyl isobutyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate.

* * * * *